United States Patent
Bilecki et al.

(10) Patent No.: US 6,640,422 B1
(45) Date of Patent: Nov. 4, 2003

(54) DEVICE FOR THE ASSEMBLY OF PRINTED CIRCUIT BOARDS

(75) Inventors: Georg Bilecki, Feuchtwangen (DE); Holger Nollek, Dinkelsbuehl (DE)

(73) Assignee: AMP Deutschland GmbH (DE)

( * ) Notice: Subject to any disclaimer, the term of this patent is extended or adjusted under 35 U.S.C. 154(b) by 331 days.

(21) Appl. No.: 09/639,294

(22) Filed: Aug. 15, 2000

(30) Foreign Application Priority Data

Aug. 17, 1999 (EP) .............................................. 99116076

(51) Int. Cl.[7] ................................................. B23P 19/00
(52) U.S. Cl. .......................................... 29/739; 29/845
(58) Field of Search ......................... 29/739, 740, 743, 29/832, 834, 842, 831, 845; 74/569, 55; 156/556, 572, 538; 414/222, 222.01, 222.05, 737

(56) References Cited

U.S. PATENT DOCUMENTS

| | | | | |
|---|---|---|---|---|
| 3,780,415 A | * | 12/1973 | Ragard | 227/90 |
| 4,624,050 A | * | 11/1986 | Hawkswell | 29/740 |
| 5,333,373 A | * | 8/1994 | Camsell et al. | 29/739 |
| 5,876,556 A | * | 3/1999 | Takanami | 156/556 |
| 6,098,275 A | * | 8/2000 | Wuyts et al. | 29/741 |
| 6,293,003 B1 | * | 9/2001 | Sakurai et al. | 29/740 |
| 6,513,233 B1 | * | 2/2003 | Nakao et al. | 29/740 |
| 6,571,465 B1 | * | 6/2003 | Shirakawa | 29/832 |

* cited by examiner

Primary Examiner—Carl S. Miller

(57) ABSTRACT

A device for the assembly of printed circuit boards with contacts having one or more terminal posts for insertion into corresponding holes in the printed circuit board in different orientations, the device comprising a guide block which executes a raising and lowering movement perpendicular to the printed circuit board; a transport device operated by the guide block for supplying the contacts secured to a carrier strip, with a cutting device operated by the guide block for the removal of the carrier strip; a setting finger operated by the guide block for holding and inserting one of the contacts with terminal posts into the printed circuit board, characterised in that the setting finger is coupled to the guide block and executes with the guide block a corresponding movement perpendicular to the printed circuit board, and the setting finger is connected to a curved groove cylinder the axis of which coincides with the perpendicular movement direction and which has at least one curved groove on its cylinder jacket, the setting finger and curved groove cylinder are rotatable about this axis and that a fixed carrier arrangement is provided with at least one post which engages into the curved groove, whereby a rotation corresponding to the curved groove from setting finger and curved groove cylinder is imposed as a function of the perpendicular movement.

17 Claims, 10 Drawing Sheets

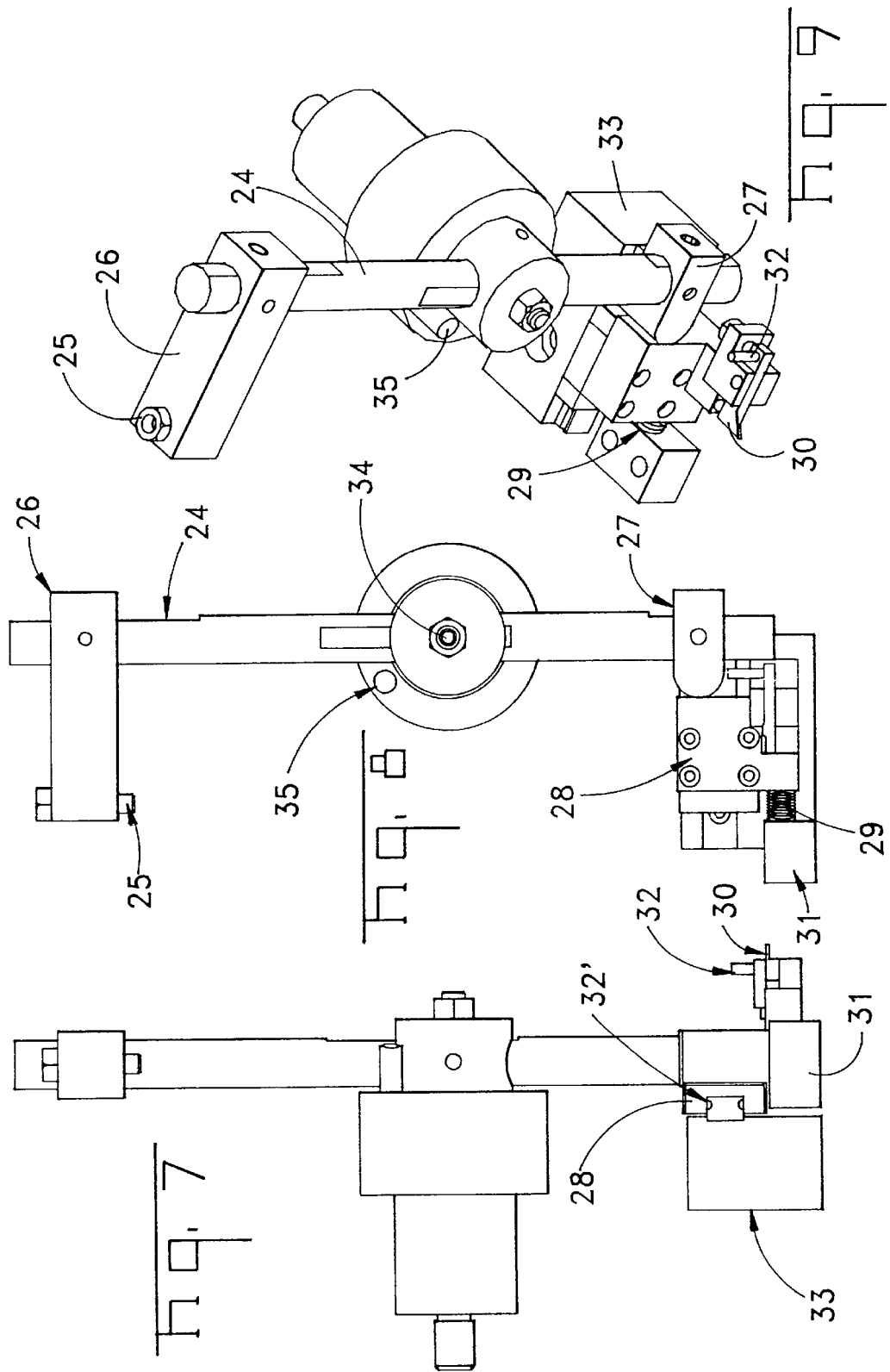

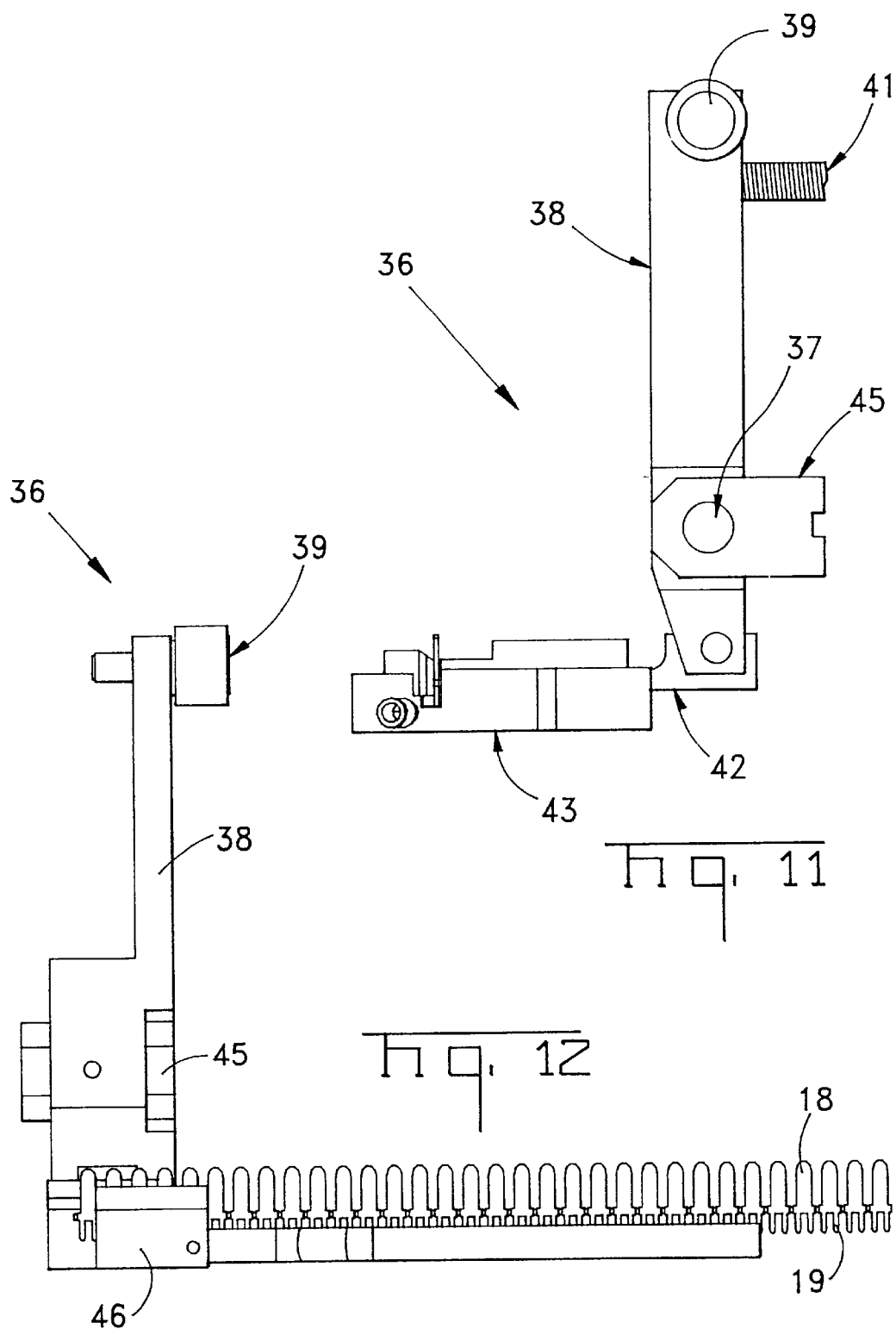

DEVICE FOR THE ASSEMBLY OF PRINTED CIRCUIT BOARDS

BACKGROUND OF THE INVENTION

The invention relates to a device for the assembly of printed circuit boards with contacts that have one or more terminal posts for insertion into corresponding holes in the printed circuit board.

DESCRIPTION OF THE PRIOR ART

It is of particular advantage if during the assembly of printed circuit boards with contacts one can utilize automatic devices. It is known that such automated devices can detach contacts from a carrier strip and insert the contacts into the printed circuit board. The contacts have one or more terminal posts that are inserted into corresponding holes in the printed circuit board. The contacts can also be bushings or blade contacts. The terminal posts can be designed with press-fit posts or as solder posts. In these cases, the way in which the setting finger is operated is very variable.

Since the orientation of the contacts on the printed circuit board is often not the same for all contacts it is customary to assemble the printed circuit boards on a rotatory table in order to change the position relative to the setting finger.

SUMMARY OF THE INVENTION

It is an object of the invention to provide a device for the assembly of printed circuit boards which is simply constructed and which, despite this simple construction, carries out the three essential functions of:

transport of the carrier strip with the contacts;

cutting and removal of the carrier strip and holding; and, inserting the individual contacts in different orientations.

The object is achieved by a device for the assembly of printed circuit boards with contacts having one or more terminal posts for insertion into corresponding holes in the printed circuit board in different orientations, the device comprising a guide block which executes a raising and lowering movement perpendicular to the printed circuit board; a transport device operated by the guide block for supplying the contacts secured to a carrier strip, with a cutting device operated by the guide block for the removal of the carrier strip; a setting finger operated by the guide block for holding and inserting one of the contacts with terminal posts into the printed circuit board, characterized in that the setting finger is coupled to the guide block and executes with the guide block a corresponding movement perpendicular to the printed circuit board, and the setting finger is connected to a curved groove cylinder the axis of which coincides with the perpendicular movement direction and which has at least one curved groove on its cylinder jacket, the setting finger and curved groove cylinder are rotatable about this axis and that a fixed carrier arrangement is provided with at least one post which engages into the curved groove, whereby a rotation corresponding to the curved groove from setting finger and curved groove cylinder is imposed as a function of the perpendicular movement.

It is of particular advantage that the given device is simply constructed as a result of the guide surfaces used.

Furthermore it is of particular advantage that as a result of this simple construction a variation in the transport length and the transverse displacement of the setting finger is easy to achieve through the simple adjustment of corresponding adjusting screws.

As a result of the simple construction it is furthermore easily to replace the setting finger and the cutting knife to process a different type of contact.

Furthermore it is of particular advantage that, through the use of a curved cylinder, a rotation of the setting finger about any predetermined angle at any predetermined point in time, determined by the shape of the curved groove, is easily achieved.

It is furthermore of particular advantage that a plurality of rotation angles can be realized by means of different curved grooves on a single curved groove cylinder and a rearrangement can be implemented by the simple transfer of a guide post which cooperates with the curved groove.

BRIEF DESCRIPTION OF THE DRAWINGS

FIG. 7 is a side view of the transport device in accordance with the embodiment example of FIG. 1;

FIG. 8 is a corresponding view of the transport device;

FIG. 9 is a perspective view of the transport device;

FIG. 11 is a side view of the corresponding cutting device;

FIG. 12 is a front view of the corresponding cutting device; and

FIG. 13 is a partial view of the cutting device and of the setting finger during processing of the second contact.

DETAILED DESCRIPTION OF THE PREFERRED EMBODIMENT

Figure 1:
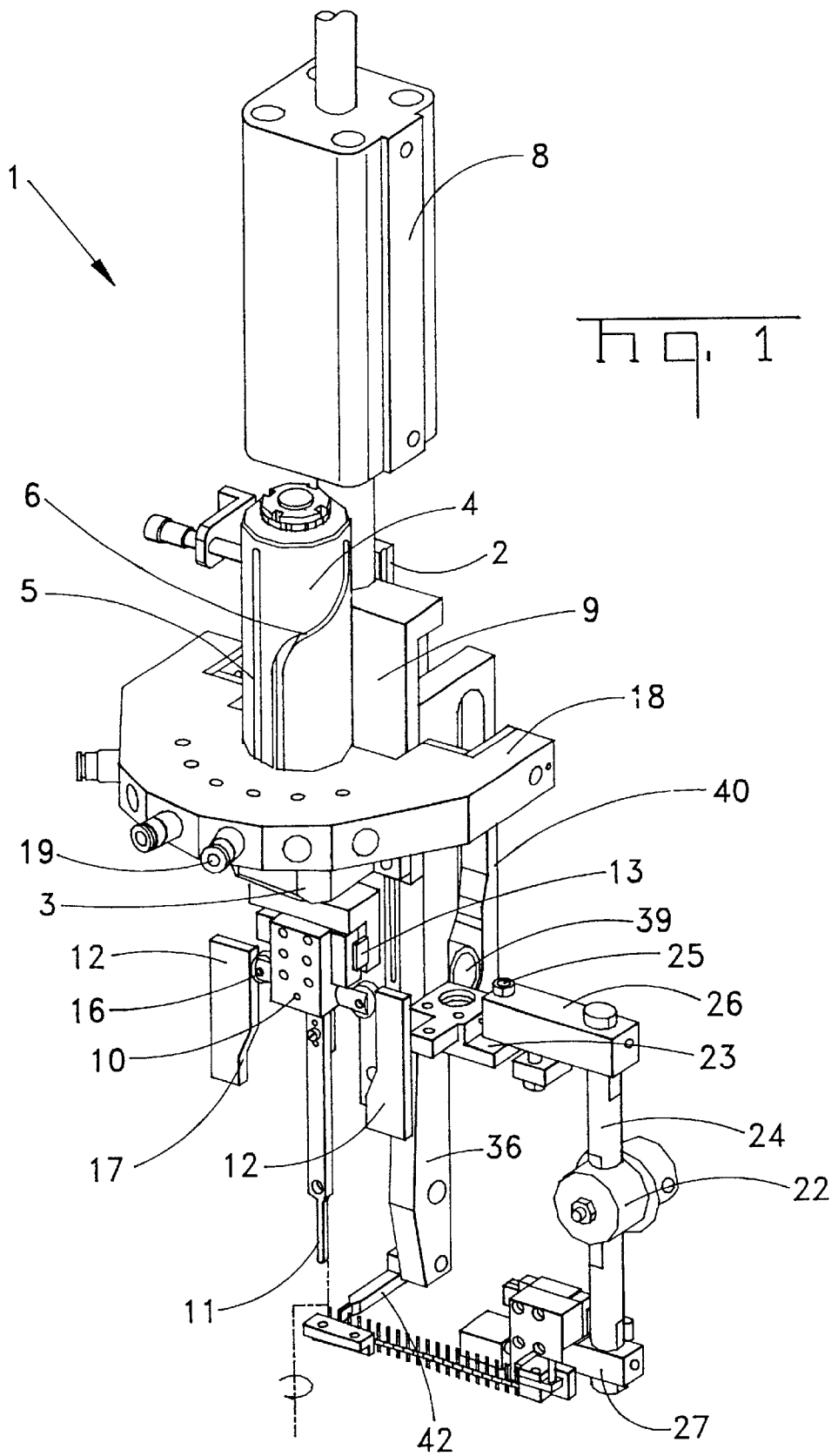
FIG. 1 is a perspective view of a device for the processing first contacts in accordance with a first embodiment.
Figure 2:
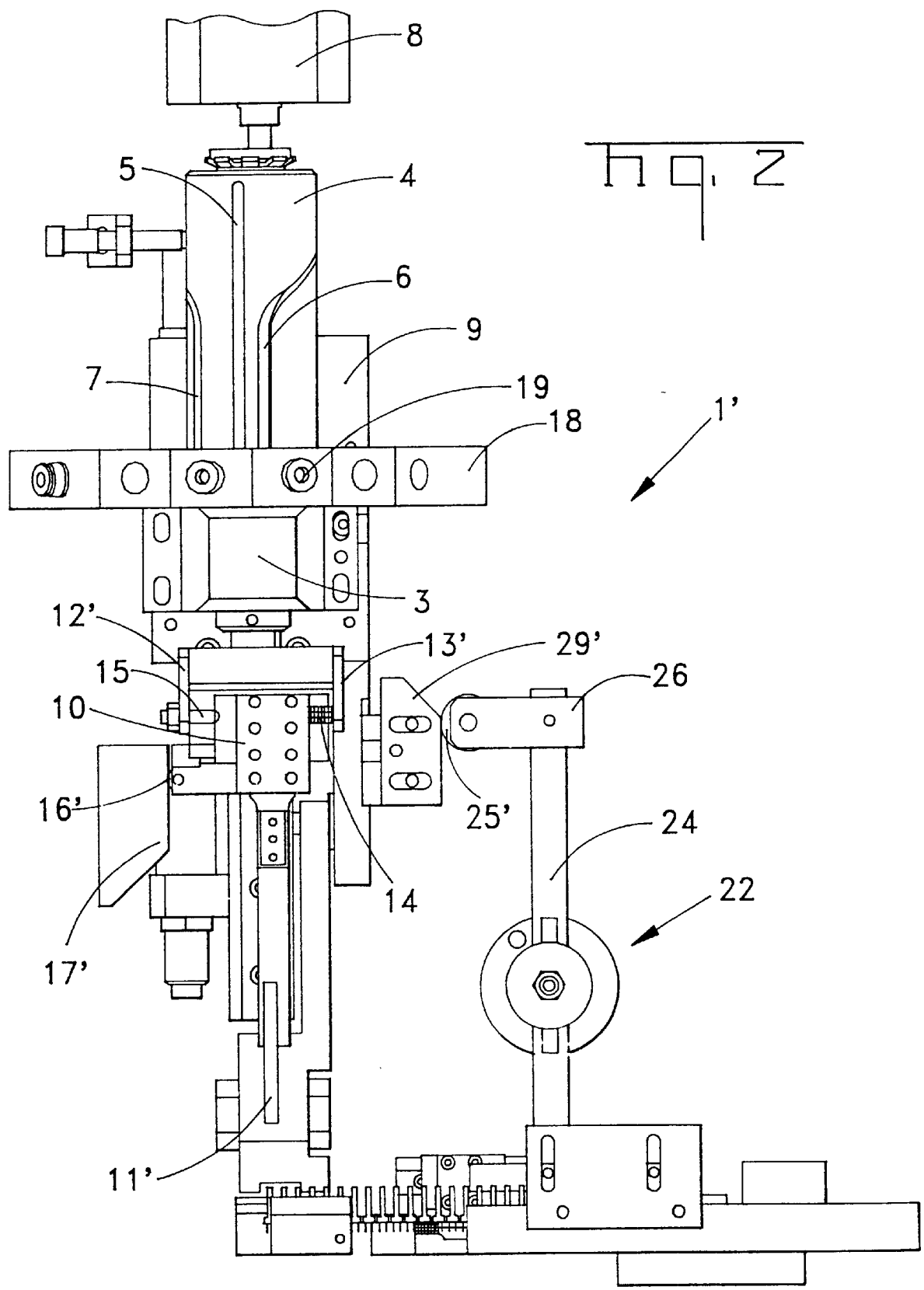
FIG. 2 is a front view of a device for the processing second contacts in accordance with a second embodiment.
Figure 3:
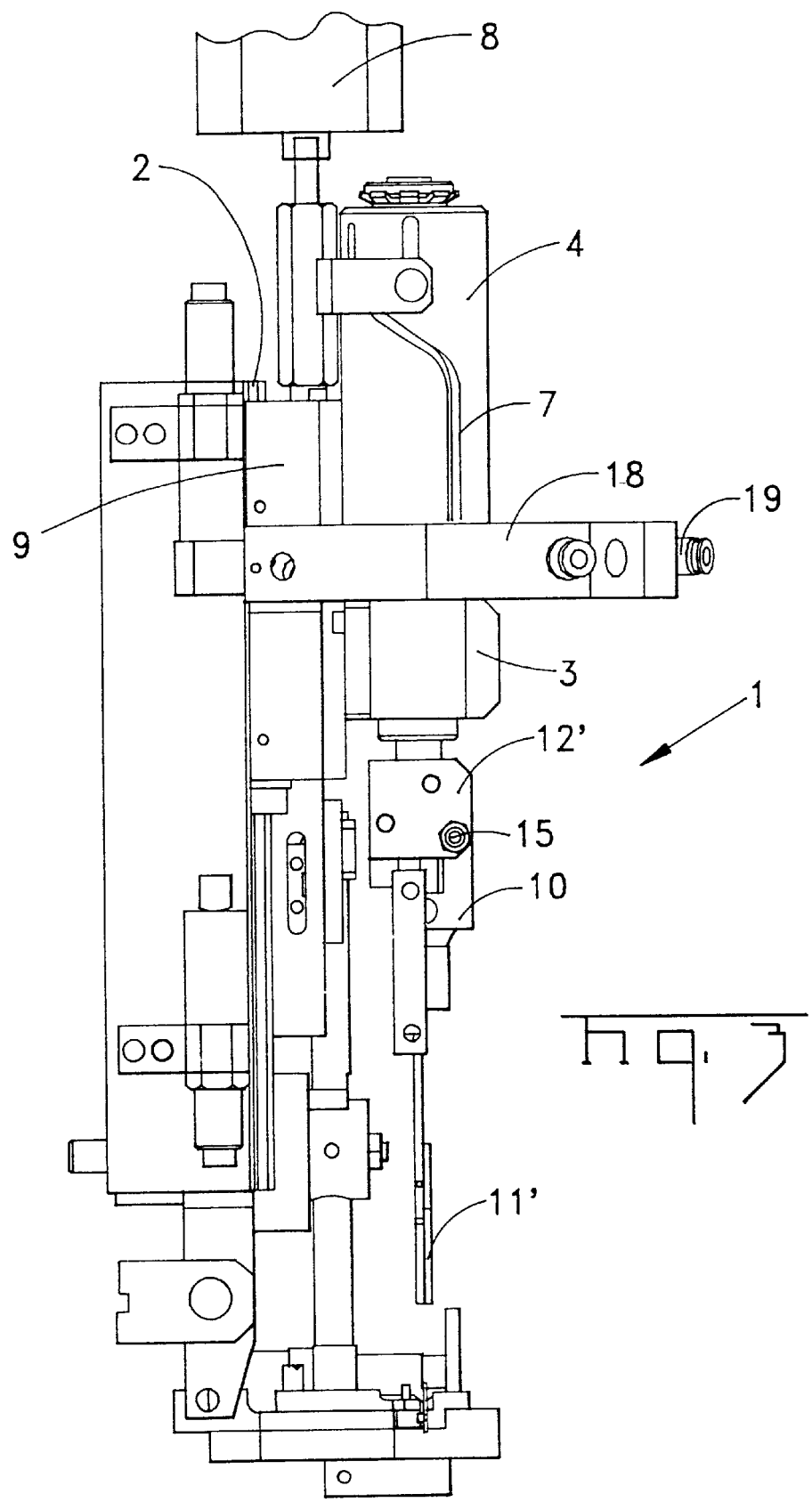
FIG. 3 shows the corresponding device in a first side view.
Figure 4:
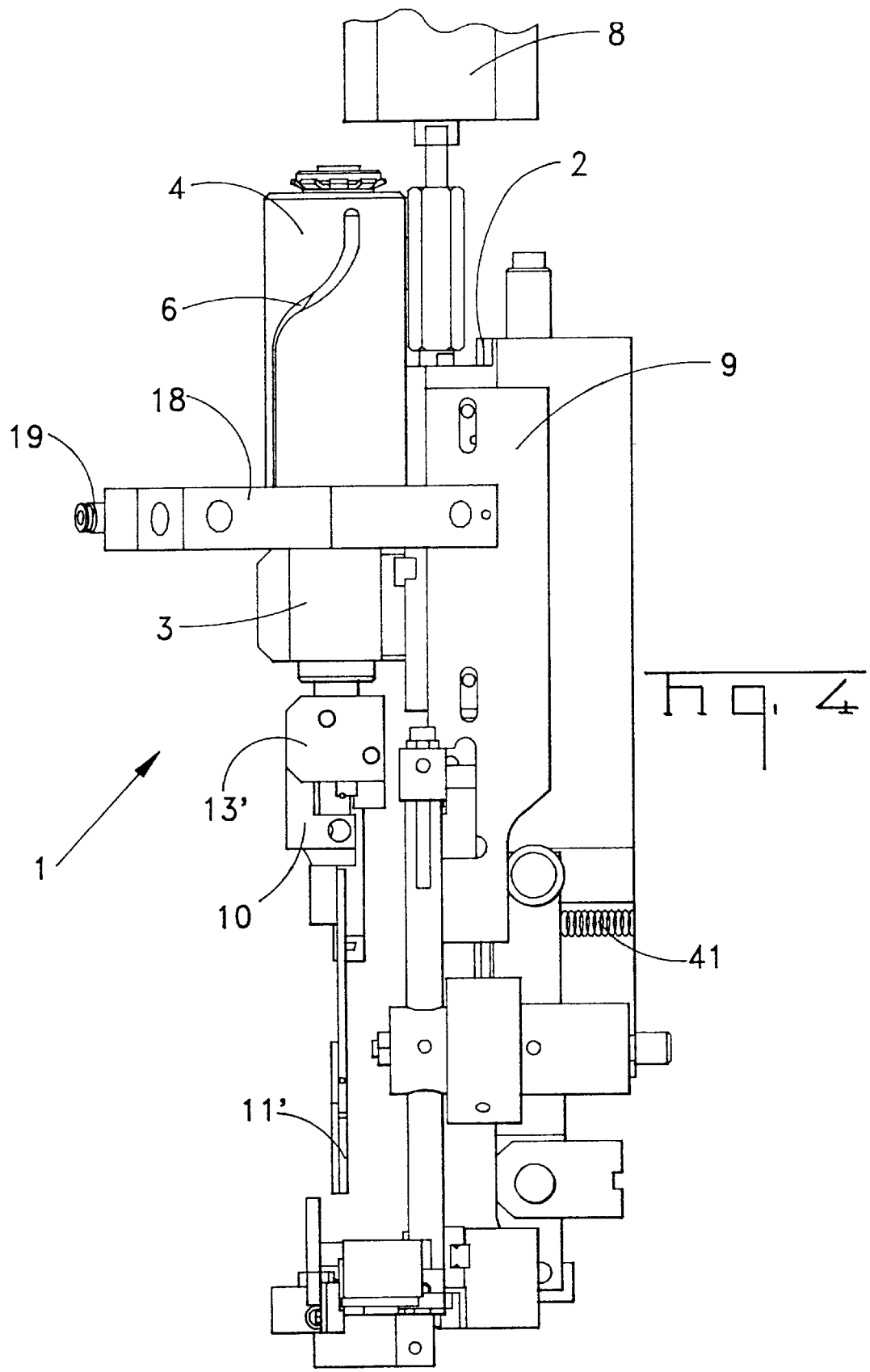
FIG. 4 shows the corresponding device in a second side view.
Figure 5:
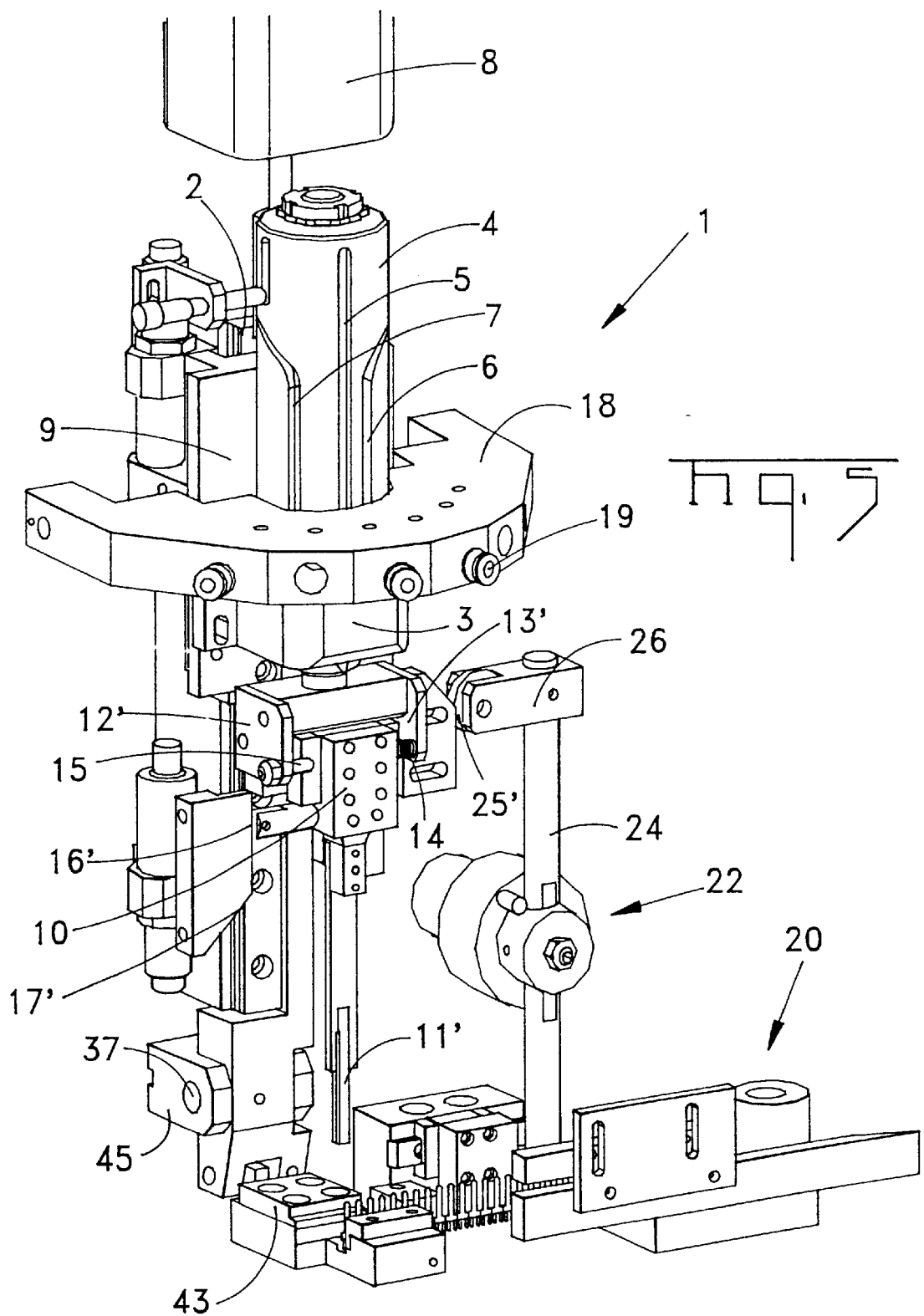
FIG. 5 is a first perspective view of the arrangement in accordance with FIG. 2.
Figure 6:
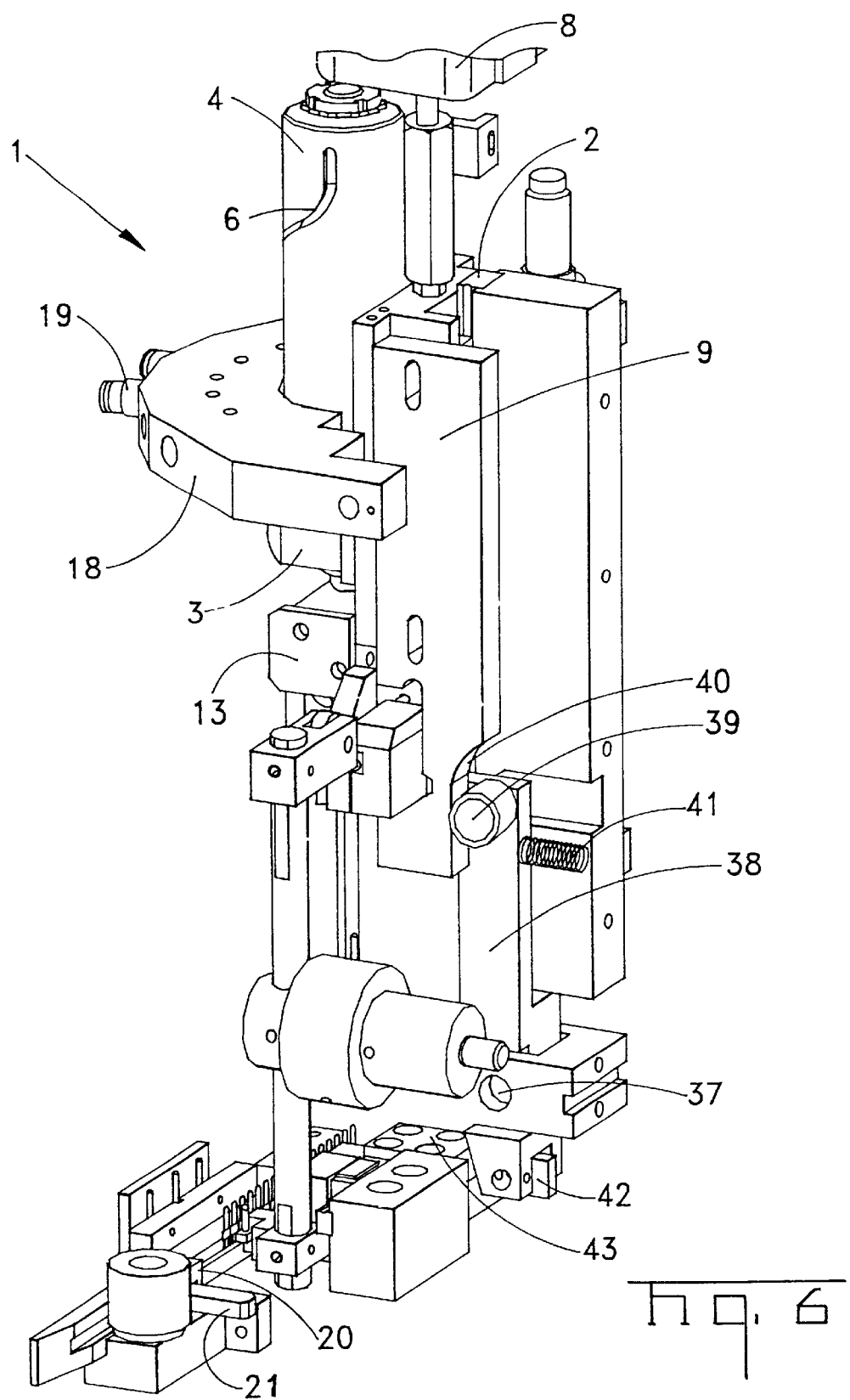
FIG. 6 is a further perspective view of the device in accordance with FIG. 2.
Figure 10:
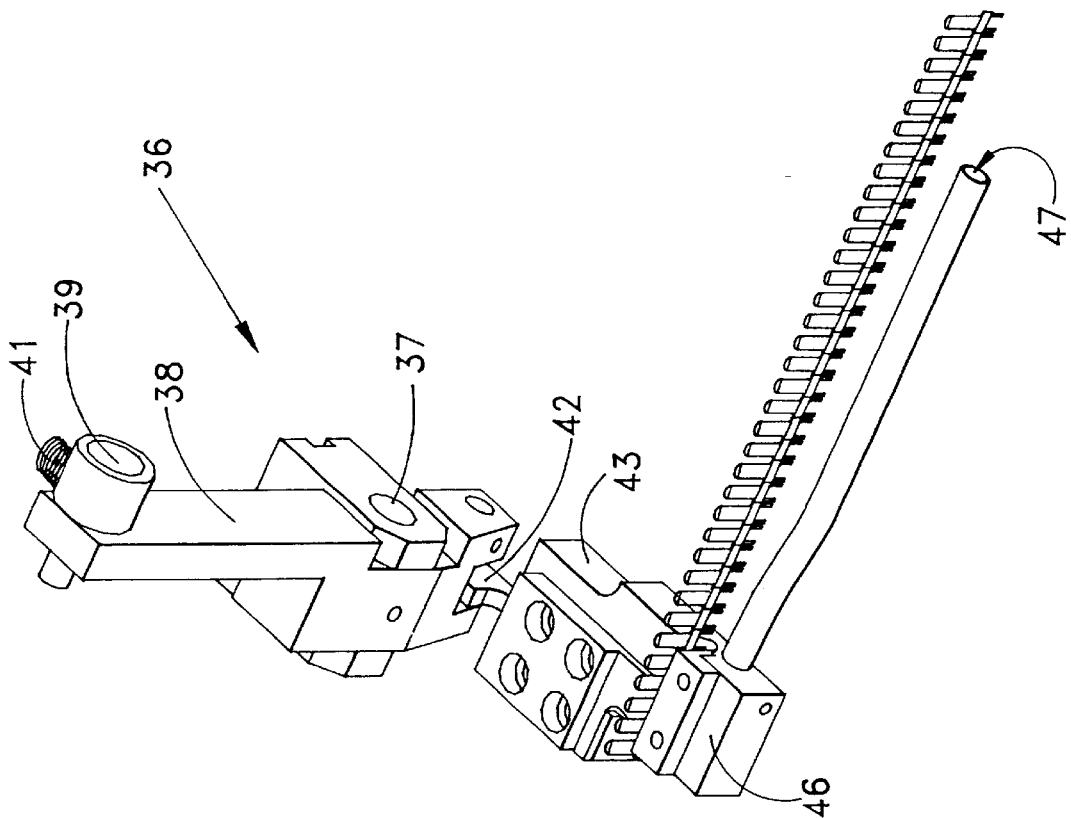
FIG. 10 shows a section of the device with the cutting and suction device during machining of the first contact.
Figure 17:
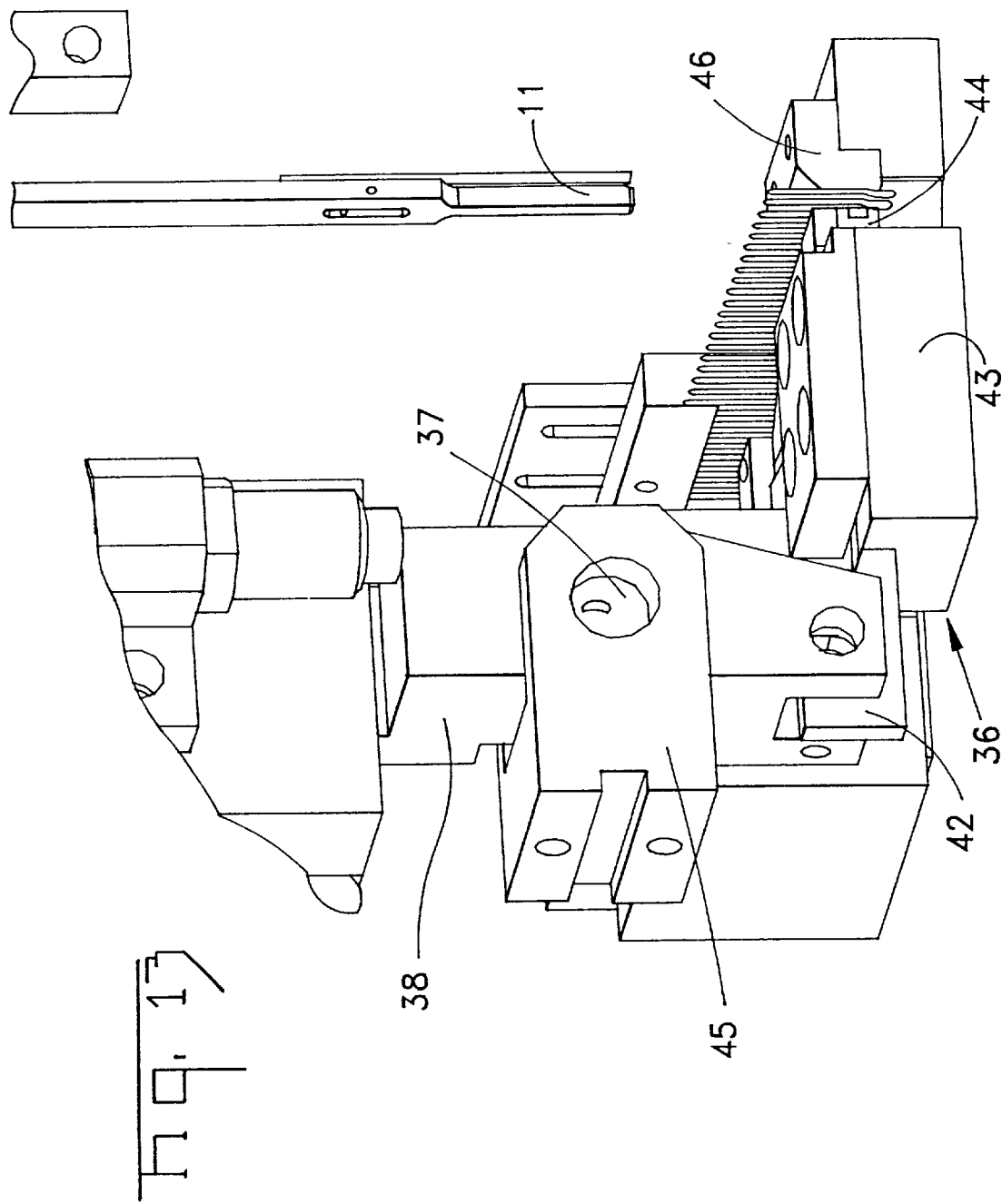

FIG. 1 is a perspective view of a first embodiment of a device 1 according to the invention. The device 1 can have a housing (not illustrated here) to which all fixed (stationary) elements are secured. Part of the device 1 is a drive unit 8, for example a pneumatically driven cylinder 8 which is installed in a fixed position. The piston of the cylinder 8 is connected to a guide block 9. The guide block 9 executes a raising and lowering movement. Guidance is brought about not only by the cylinder of the drive unit 8 but can also occur, for example, in that the guide block 9 is guided over a rail 2 that is also installed in a fixed position.

The guide block 9 is connected to a curved groove cylinder 4 by a receiver 3. The curved groove cylinder 4 is rotatably mounted about its axis in the receiver 3 and its axis extends parallel to the raising and lowering movement of the piston and therefore of the block 9. The curved groove cylinder 4 has a plurality of curved grooves 5 to 7 in its cylinder jacket. A curved groove 5 extends straight and parallel to the axis of the curved groove cylinder 4, other curved grooves 6, 7 have straight and curved sections.

A setting finger receiver 10 is connected to the curved groove cylinder 4. The setting finger 11 is secured in this setting finger receiver 10. The setting finger 11 can have a different appearance depending on the contact to be processed and is easily replaceable. The setting finger receiver 10 is displaceably arranged in a horizontal direction. The setting finger receiver 10 is located between two plates 12 each with a guide surface 17. A wheel 16 which runs on the guide surface 17 is located on each of the opposing sides of the setting finger receiver 10. The setting finger receiver is arranged so as to be transversely displaceable on a guide rail 13. Upon lowering of the setting finger receiver 10 this is then laterally displaced as a result of the interaction between the wheel 16 and the guide surfaces 17.

A movement of the guide block 9, and therefore of the curved groove cylinder 4, downwards (upwards) causes a movement of the setting finger 11 initially downwards (upwards), then downwards (upwards) and laterally and then only downwards again. During the first movement downwards the setting finger 11 travels on the contact to be processed and holds this. During the lateral and lowering movement the contact is moved laterally and downwards. The subsequent lowering movement serves to rotate and press-fit the contact with the press-fit post in a hole which is provided for this purpose in a printed circuit board.

The rotation of the contact and the setting finger 11 is achieved in that a post 19 secured to a fixed holding part 18 engages in a curved groove 5 to 7. Upon lowering of the guide block 11 and therefore of the curved groove cylinder 4, the post 19 runs through the curved groove 5 to 7 and the curved groove cylinder 4 undergoes a positively-driven movement initially perpendicularly downwards, then rotationally downwards. The curved grooves 6, 7 are designed in this case such that the rotation follows the transversal movement of the setting finger 11 corresponding to the guide surfaces 17. The curved groove 5 does not cause any rotation of the setting finger 11.

In addition to the setting finger 11 for holding and pressing in of the individual contacts onto a printed circuit board, the guide block 9 also operates a transport device 22 for supplying the contacts secured to a carrier strip. The transport device 22 is also to be operated with the aid of the movement of the guide block 9. Whenever the placement process of a contact has finished, the movement of the carrier strip should always be triggered around a contact at the end of the raising movement of the guide block 9. This is achieved in that a shoulder 23 is provided on the block 9 and a lever arrangement 24 is operated by means of this shoulder 23 which is the main component of the transport device 22.

An adjusting screw 25 is located between the shoulder 23 and the point of application of the lever arrangement 24 by means of which it can be controlled when the lever 24 is operated. The adjusting screw 25 is located in a transverse arm 26 which is secured to the lever arrangement 24. Located at the other end of the lever there is also a transverse arm 27 with which upon operation of the lever 24 a slider 28 is laterally displaced against the spring force of a spring 29. A latch 30 is connected to the slider 28 which engages between the contacts in the carrier strip and causes a continuance of the carrier strip through the displacement of the slider 28. The spring 29 is secured to a stop 31 which is again fixed, for example secured to a base wall of a housing. A small grip handle 32 is located on the latch 30 with which a hand operation of the latch for manual displacement is possible. The slider 28 is guided over a guide rail 32', which is secured to a guide block 33 which in turn is secured to the base wall for example.

When the guide block 9 is lowered the lever 24 is moved back by the spring 29, and the latch 30 glides along a contact. The backward movement of the lever is stopped in that a stop 35 is located close to the fulcrum 34 of the lever which stops the movement of the lever. As can clearly be seen from FIGS. 7 to 9 both the transverse arms 26, 27 are displaceable on the lever arrangement 24 and the lever is displaceable in relation to the fulcrum 34 whereby a very variable adjustment of the transport path is made possible. The axis 34 with the fulcrum of the lever is secured for example to the housing or applied in fixed position in some other way.

It has now been explained how the contacts secured to the carrier strip are transported and how the individual contacts are held by the setting finger and introduced into the printed circuit board. It must now be explained how the contacts are separated from the carrier strip. This is achieved with the so-called cutting device 36.

The cutting device 36 is illustrated for the purpose of clarity in the FIGS. 10 to 13. The cutting device 36 is also composed of a lever arrangement with an axis of rotation 37 and a lever 38. A rotatable wheel 39 is located at the upper end of the lever 38. This wheel 39 is guided along a guide surface 40 which is part of the guide block 9. The guide surface 40 is curved. A spring 41 is located between the lever 38 and the back wall 5 of the housing 2. The spring 41 presses the wheel 39 against the guide surface 40. If the guide block 9 now moves downwards the upper end of the lever 38 is pressed against the spring force of the spring 41 as a result of the curvature of the guide surface 40. The lever 38 rotates in this case about the lever axis 37. An arm 42 is located at the other end of the lever which is guided through a guide arrangement 43 and at the end of which there is located a punching tool 44. The arm 42 is flexibly connected to the lever 38. The punching tool 44 can have different appearances. It punches out completely the superfluous part of the carrier strip. Its appearance can vary depending on the contact used and has a projection gripping between the contacts. The part 45 which supports the axis 37 is connected to the rear wall 5 of the housing.

The guide surface 40 is arranged in such a way that upon lowering of the guide block 9 the setting finger 11 initially holds the contact and then the punching tool 44 detaches the carrying strip. Then the contact is introduced laterally and then downwards into a printed circuit board with the terminal post from the setting finger 11.

In the region of the punching tool and of the opposing anvil 46 there is located a suction unit with a suction hose 47 with which the superfluous parts of the carrier strip which have been punched out are sucked off.

A second embodiment is illustrated in FIGS. 2 to 6. Here the essential differences between this device 1' and the device explained with the aid of FIG. 1 are given.

The setting finger receiver 10 is displaceably arranged between two holding plates 12' and 13'. A spring 14 is located between the holding plate 13' and the setting finger receiver 10. This spring 14 presses the setting finger receiver 10 in the direction of the holding plate 12'. An adjusting screw 15 is located in the holding plate 12' which serves as a stop for the setting finger receiver 10 in its movement. Since this stop is adjustable by means of an adjusting screw 15 the possible lateral movement of the setting finger receiver 10 and therefore of the setting finger 11 also can be variably adjusted.

A wheel 16' which is secured so as to be capable of rotating on the setting finger receiver 10 is located thereon. A fixed wall is provided with a guide surface 17' which extends perpendicularly in its upper region and is inclined in the lower region. If the guide block 9 is now moved downwards by the drive unit 8 the setting finger receiver 10 is also moved downwards. Therefore the setting finger 11 also moves. It grasps a contact. The wheel 16' moves along the guide surface 17' during the downwards movement. As soon as the wheel 16' has reached the arrest point of the guide surface 17', a lateral movement takes place in addition to the perpendicular movement. The lateral movement is controlled by the guide surface 17' which cooperates with the wheel 16'. The lateral movement is terminated when the setting finger receiver 10 runs against the adjusting screw 15. The further downward movement of the guide block 9 then results in a downward movement of the setting finger 11 which is combined with a rotational movement depending on the curved groove used. The contact is then placed with the press-fit posts into the holes of a printed circuit board.

A transport device 22 is also operated in the second embodiment by the movement of the guide block 9. For this purpose a guide surface 23' is provided which is secured to a transverse arm 26 of the lever arrangement 24 with a wheel 25'. Upon raising and lowering of the guide block 9 the guide surface 23', and therefore the wheel 25' with the lever arrangement 24 also move.

The individual contacts to be processed are connected to one another by a carrier strip. A braking arrangement 20 is provided with which a brake block is pressed against the contacts by a spring in order to prevent a displacement of the carrier strip with the contacts. The braking arrangement can be released by a lever 21.

We claim:

1. A device for the assembly of printed circuit boards with contacts having one or more terminal posts for insertion into corresponding holes in the printed circuit board in different orientations, the device comprising a guide block which executes a raising and lowering movement perpendicular to the printed circuit board; a transport device operated by the guide block for supplying the contacts secured to a carrier strip, with a cutting device operated by the guide block for the removal of the carrier strip; a setting finger operated by the guide block for holding and inserting one of the contacts with terminal posts into the printed circuit board, characterized in that the setting finger is coupled to the guide block and executes with the guide block a corresponding movement perpendicular to the printed circuit board, and the setting finger is connected to a curved groove cylinder the axis of which coincides with the perpendicular movement direction and which has at least one curved groove on its cylinder jacket, the setting finger and curved groove cylinder are rotatable about this axis and that a fixed carrier arrangement is provided with at least one post which engages into the curved groove, whereby a rotation corresponding to the curved groove, of the setting finger and curved groove cylinder is imposed as a function of the perpendicular movement.

2. Device for the assembly of printed circuit boards according to claim 1, wherein the setting finger is movable in the direction parallel to the printed circuit board, in that a guide surface is provided which initially extends perpendicular to the printed circuit board and then inclined to the printed circuit board, in that the setting finger is loaded by a spring force towards the guide surface in such a way that upon raising and lowering of the guide block a displacement of the setting finger parallel to the printed circuit board occurs and in that a rotational movement of the setting finger occurs upon lowering after the displacement parallel to the printed circuit board and upon prior raising.

3. Device for the assembly of printed circuit boards according to claim 2, wherein a stop is provided, that the setting finger is initially pressed against the guide surface by the elastic force up to a certain predetermined position and thereafter is pressed against the stop.

4. Device for the assembly of printed circuit boards according to claim 2, wherein the stop is variably adjustable and therefore the lateral displacement of the guide finger is adjustable.

5. Device for the assembly of printed circuit boards according to claim 1, wherein a wheel is provided which is coupled to the guide finger and runs against the guide surface.

6. Device for the assembly of printed circuit boards according to claim 1, wherein the setting finger is replaceable in order to enable the setting of different contacts.

7. Device for the assembly of printed circuit boards according to claim 1, wherein a lever is provided through the operation of which a latch is displaced which further transports the carrier strips with the contacts by one contact.

8. Device for the assembly of printed circuit boards according to claim 7, wherein the lever cooperates with the guide block in that this operates the lever during the raising movement shortly before the arrest point.

9. Device for the assembly of printed circuit boards according to claim 1, wherein a braking arrangement is provided which holds the carrier strips with the contacts.

10. Device for the assembly of printed circuit boards according to claim 1, wherein a further lever arrangement is provided which is operated upon lowering of the guide block and is part of the cutting device.

11. Device for the assembly of printed circuit boards according to claim 10, wherein the lever device is operated against a spring force via a curved guide surface which is provided on the guide block.

12. Device for the assembly of printed circuit boards according to claim 11, wherein the first guide surface for the operation of the setting finger and the second guide surface for the operation of the lever arrangement are matched to one another in such a way that the setting finger initially grasps and holds the contact, then the contact is detached from the transport strip in that the lever arrangement is operated and then the contact is transported laterally to its position on the printed circuit board and inserted.

13. Device for the assembly of printed circuit boards according to claim 1, wherein a suction device is provided which serves to suck off the carrier strip pieces.

14. Device for the assembly of printed circuit boards according to claim 1, wherein the transport length of the transport device is adjustable.

15. Device according to claim 1, wherein the curved groove cylinder has a plurality of curved grooves and that the post engages in one of these curved grooves.

16. Device according to claim 15, wherein at least one of the curved grooves extends straight and parallel to the axis of the curved groove cylinder and therefore also enables a rotation of the setting finger of 0°.

17. Device according to claim 2, wherein the curved grooves have a straight section which extends parallel to the axis and a curved section in such a way that rotational movements occur laterally one after the other and are parallel and offset.

* * * * *